(12) United States Patent
Ozaki

(10) Patent No.: US 6,521,929 B2
(45) Date of Patent: Feb. 18, 2003

(54) SEMICONDUCTOR DEVICE HAVING FERROELECTRIC MEMORY CELLS AND METHOD OF MANUFACTURING THE SAME

(75) Inventor: Tohru Ozaki, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/816,245

(22) Filed: Mar. 26, 2001

(65) Prior Publication Data

US 2002/0000585 A1 Jan. 3, 2002

(30) Foreign Application Priority Data

Mar. 27, 2000 (JP) .......................... 2000-087388

(51) Int. Cl.[7] ...................... H01L 27/108; H01L 29/76; H01L 29/94; H01L 31/119
(52) U.S. Cl. ................. 257/295; 257/306; 257/308
(58) Field of Search ................. 257/295–310; 438/253–254, 240–241, 3, 396–398

(56) References Cited

U.S. PATENT DOCUMENTS 5,903,492 A   5/1999  Takashima
6,190,957 B1 * 2/2001 Mochizuki et al.
6,235,542 B1 * 5/2001 Yu ................................. 438/3
6,235,573 B1 * 5/2001 Lee et al. .................... 257/310

* cited by examiner

Primary Examiner—Steven Loke
Assistant Examiner—Cuong Quang Nguyen
(74) Attorney, Agent, or Firm—Oblon, Spivak, McClelland, Maier & Neustadt, P.C.

(57) ABSTRACT

A semiconductor device having ferroelectric memory cells has memory cell transistors each including first and second source/drain regions. Plug electrodes are formed in contact with the first and second source/drain regions, respectively. A ferroelectric capacitor is formed on the plug electrode connected to the first source/drain region. The ferroelectric capacitor includes a first lower electrode formed on the plug electrode, a ferroelectric film formed on the first lower electrode, and an upper electrode formed on the ferroelectric film. A second lower electrode is formed on the plug electrode connected to the second source/drain region. Wiring is formed to connect the upper electrode to the corresponding second lower electrode.

13 Claims, 18 Drawing Sheets

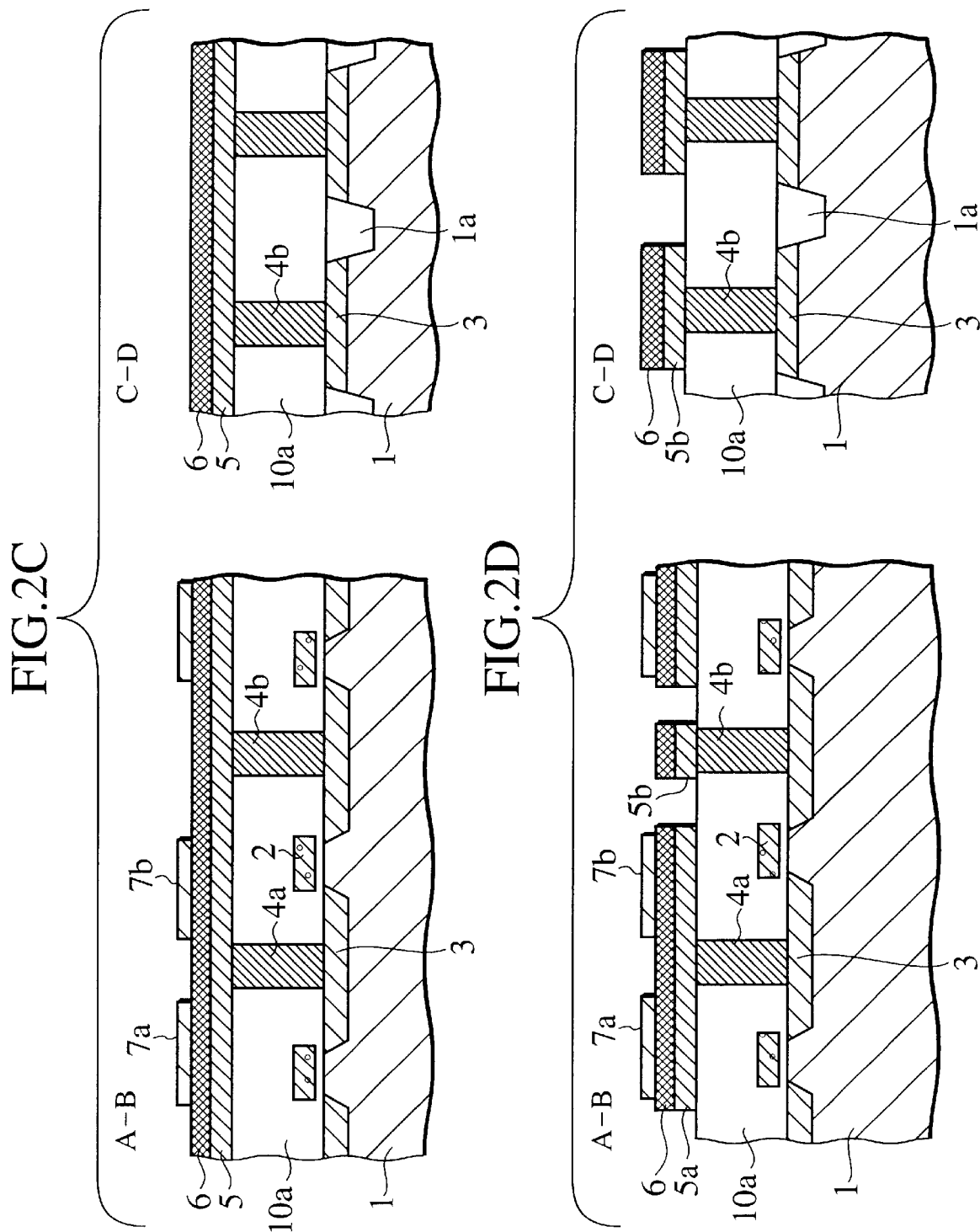

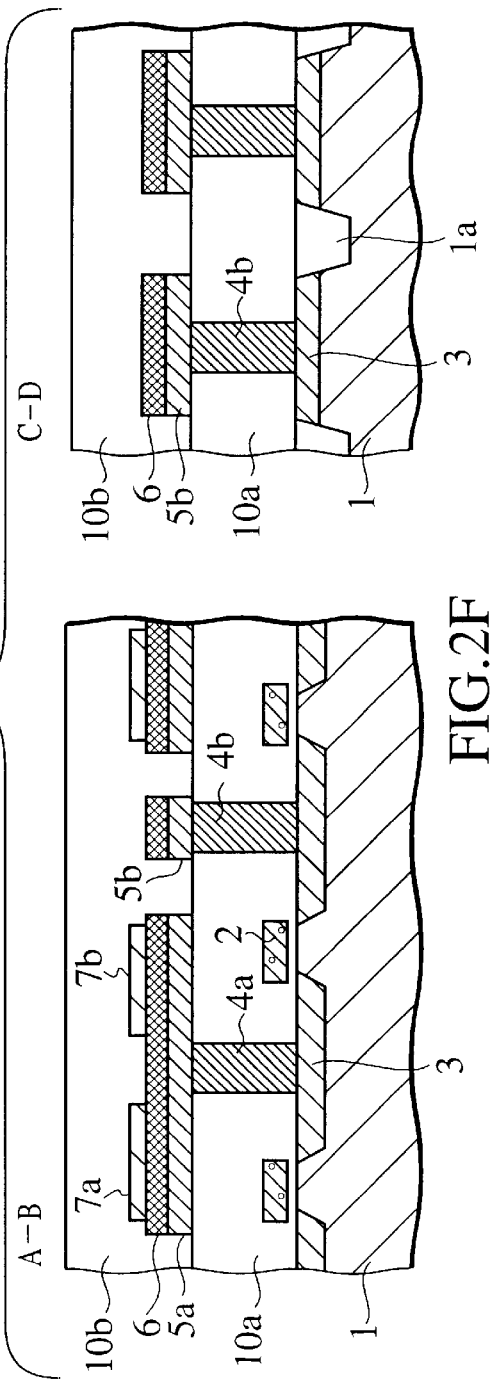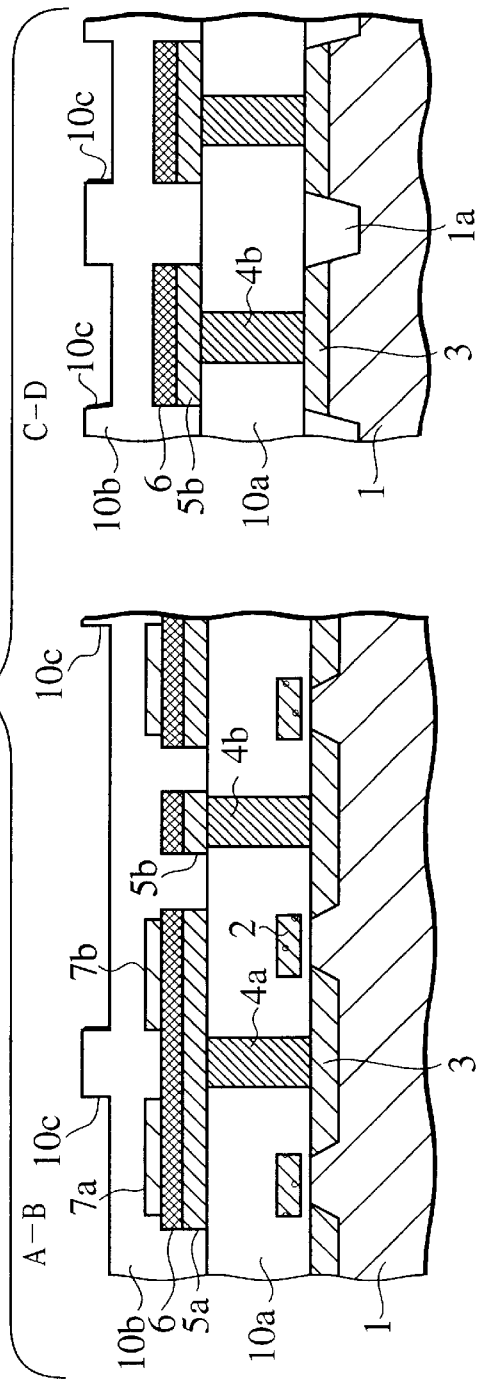

SEMICONDUCTOR DEVICE HAVING FERROELECTRIC MEMORY CELLS AND METHOD OF MANUFACTURING THE SAME

CROSS REFERENCE TO RELATED APPLICATIONS

This application claims benefits of priority under 35 USC 119 to Japanese Patent Application No. 2000-087388 filed on Mar. 27, 2000, the entire contents of which are incorporated by reference herein.

BACKGROUND OF THE INVENTION

1. Field of the Invention

The present invention relates to a semiconductor device having memory cells including ferroelectric capacitors, and a method of manufacturing such a semiconductor device.

2. Description of the Related Art

Recently a ferroelectric memory which consists of series connected memory cells each having a transistor having a source terminal and a drain terminal and a ferroelectric capacitor in-between said two terminals, hereafter named "Series connected TC unit type ferroelectric RAM" has been introduced by D. Takashima et. al in JSSCC, pp. 787–792, May, 1998. This memory is effective to reduce a total chip size.

FIG. 14 is a circuit diagram showing part of a memory cell area of such a Series connected TC unit type ferroelectric RAM.

This ferroelectric memory has a 2.5-V bit line BL and a 0-V plate line PL. Between the lines BL and PL, a select gate 50 and ferroelectric memory cells 60-1, 60-2, and the like are connected in series. Each of the ferroelectric memory cells, for example, 60-1 has a MOSFET 61-1 and a ferroelectric capacitor 62-1. The MOSFETs 61-1, 61-2, and the like are connected to word lines WL1, WL2, and the like, respectively, and are usually in an ON state to charge the ferroelectric capacitors to 0 V.

To write data into a target memory cell, a select gate 50 corresponding to the target memory cell is turned on, and the MOSFET of the target memory cell is turned off, to charge the ferroelectric capacitor of the target memory cell to 2.5 V.

One of the structural characteristics of the Series connected TC unit type ferroelectric RAM is that source/drain regions on each side of a gate electrode of a memory cell transistor are connected to the upper and lower electrodes of a ferroelectric capacitor, respectively.

FIG. 15 partly shows the structure of the Series connected TC unit type ferroelectric RAM of the prior art. A memory cell transistor (MOSFET) 61 has first and second source/drain regions 103. On the first source/drain region 103, a plug electrode 104 is formed. On the plug electrode 104, a lower electrode 105, a ferroelectric film 106, and an upper electrode 107 form a layered structure serving as a ferroelectric capacitor. The first source/drain region 103 is connected to the lower electrode 105 of the ferroelectric capacitor through the plug electrode 104, and the second source/drain region 103 is connected to the upper electrode 107 of the ferroelectric capacitor through a metal contact 108b, a metal wire 109, and a metal contact 108a.

The ferroelectric memory of this prior art realizes a series connected structure by opening a contact hole for the contact 108b on each second source/drain region 103.

After opening a contact hole on each upper electrode 107, it is preferable to carry out annealing in an oxidizing atmosphere to cure the ferroelectric film 106 which may have been damaged during the opening of the contact holes. At this time, the annealing may oxidize the source/drain region 103 if the region is exposed at the bottom of a contact hole for the contact 108b. This should be avoided, and therefore, it is difficult to carry out the curative annealing after opening contact holes according to the prior art.

In addition, the contact 108b is close to the lower electrode 105, and when forming fine memory cells, an etching gas used by reactive ion etching (RIE) to open contact holes will damage the lower electrodes 105 of ferroelectric capacitors.

Another problem is the long contacts 108b. Due to the length, each contact 108b tends to be tapered to provide insufficient conductivity.

SUMMARY OF THE INVENTION

An object of the present invention is to provide a semiconductor device having ferroelectric memory cells, capable of carrying out recovery annealing even after opening contact holes, to provide proper ferroelectric capacitor characteristics.

Another object of the present invention is to provide a method of manufacturing such a semiconductor device having ferroelectric memory cells.

In order to accomplish the objects, a first aspect of the present invention provides a semiconductor device having ferroelectric memory cells. The semiconductor device includes memory cell transistors formed on a semiconductor substrate. Each of the memory cell transistors includes first and second source/drain regions. On the first source/drain region, a first plug electrode is formed, and on the second source/drain region, a second plug electrode is formed. On the first plug electrode, a first lower electrode, a ferroelectric film, and an upper electrode form a layered structure serving as a ferroelectric capacitor. On the second plug electrode, a second lower electrode is formed from the same layer film that forms the first lower electrode. The upper electrode and the second lower electrode are electrically connected to each other through at least a contact and wiring.

A second aspect of the present invention provides a method of manufacturing the above-mentioned semiconductor device having ferroelectric memory cells. The method forms memory cell transistors on a semiconductor substrate, covers the surface of the semiconductor substrate with a first insulating interlayer, opens contact holes corresponding to source/drain regions of the memory cell transistors through the first insulating interlayer, and fills the contact holes with electrode material to form first and second plug electrodes in contact with the source/drain regions. On the surface of the substrate processed as mentioned above, the method forms a lower electrode layer, a ferroelectric film, and an upper electrode layer in this order, patterns the upper electrode layer to form a pair of upper electrodes for each memory cell, and patterns the ferroelectric film and lower electrode layer to form ferroelectric capacitors each including, on the first plug electrode, a first lower electrode, a ferroelectric film, and a pair of upper electrodes. At this time, second lower electrodes are also formed on the second plug electrodes, respectively. Thereafter, the method forms wiring and contacts to electrically connect each upper electrode to a corresponding one of the second lower electrodes.

To form the wiring and contacts, the method forms a second insulating interlayer on the substrate on which the second lower electrodes have been formed, opens contact holes and/or wiring trenches in the second insulating interlayer, and fills the contact holes and trenches with a conductive film serving as the wiring and contacts.

According to the first and second aspects, the opening of the contact holes and wiring trenches exposes no source/drain regions or plug electrodes, which are composed of oxidizable material in high temperature oxidizing atmosphere. Therefore, without damaging the source/drain regions and plug electrodes, the method can achieve annealing in a high-temperature oxidizing atmosphere to cure the ferroelectric film damaged by the opening of the contact holes and trenches and improve the characteristics of the ferroelectric film.

BRIEF DESCRIPTION OF THE DRAWINGS

FIGS. 2A to 2G are sectional views showing manufacturing processes of the semiconductor device of the first embodiment;

DETAILED DESCRIPTION OF THE EMBODIMENTS

Various embodiments of the present invention will be explained with reference to the accompanying drawings.

[First embodiment]

Figure 1A:
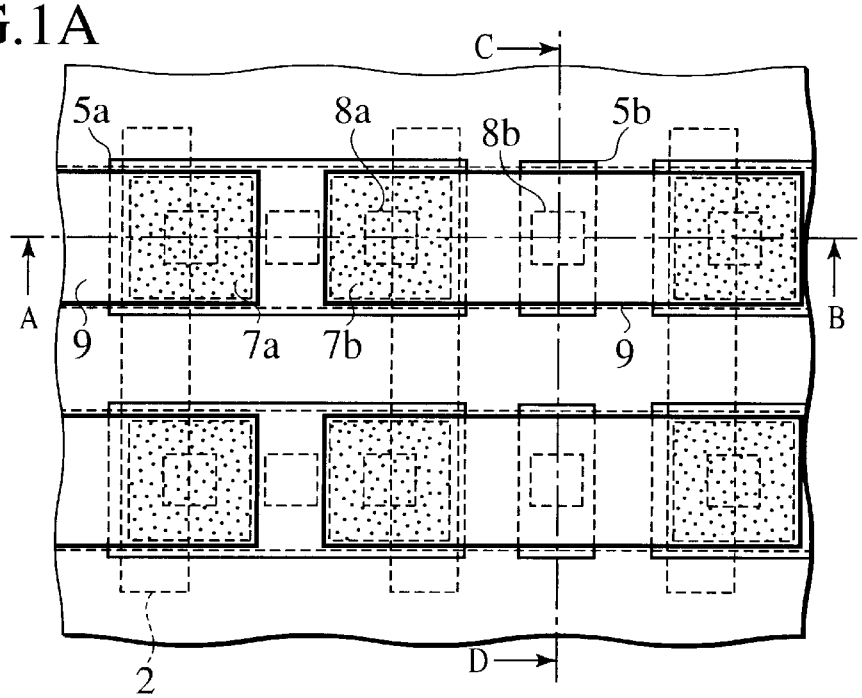
FIG. 1A is a plan view partly showing the structure of a ferroelectric memory cell area of a semiconductor device according to a first embodiment of the present invention.
Figure 1B:
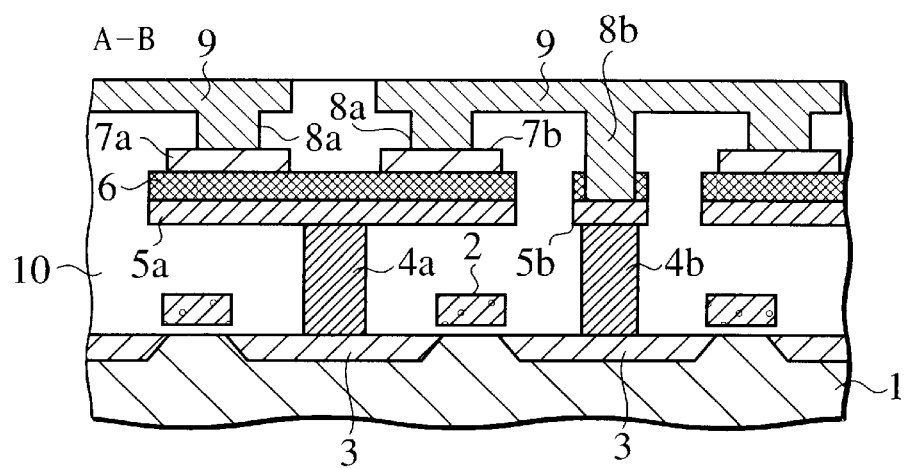
FIGS. 1B and 1C are sectional views showing the ferroelectric memory cell area of FIG. 1A.
Figure 1C:
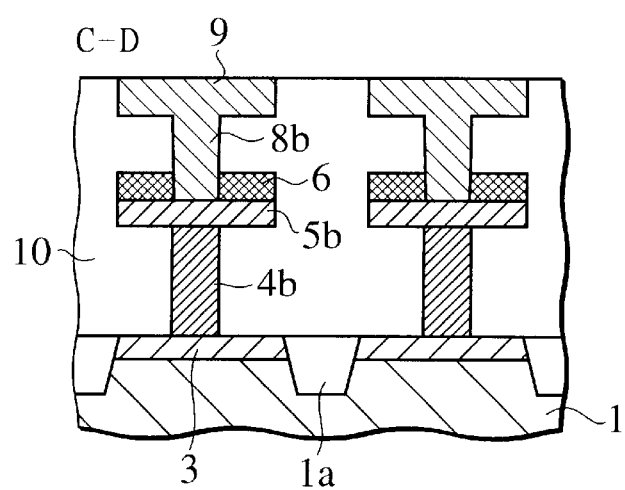

FIGS. 1A, 1B, and 1C partly show the structure of a ferroelectric memory cell area of a semiconductor device according to the first embodiment of the present invention, in which FIG. 1A is a plan view, FIG. 1B a sectional view taken along a line A-B of FIG. 1A, and FIG. 1C a sectional view taken along a line C-D of FIG. 1A.

The ferroelectric memory cell area contains memory cell transistors formed on a semiconductor substrate 1. Each memory cell transistor has source/drain regions 3 on which plug electrodes 4a and 4b are formed, respectively. On the plug electrode 4a, a lower electrode 5a, a ferroelectric film 6, and upper electrodes 7a and 7b are formed to provide a layered structure serving as a ferroelectric capacitor. On the plug electrode 4b, a lower electrode 5b is formed. Each of the upper electrodes 7a and 7b is connected to a corresponding lower electrode 5b through wiring 9.

Gate electrodes 2 are formed on the semiconductor substrate 1, and element areas between adjacent gate electrodes 2 are isolated from one another with element isolation regions 1a. In each element area, the source/drain regions (diffusion regions) 3 form a ferroelectric memory cell transistor. On the source/drain regions, the plug electrodes 4a and 4b, which are made of doped polysilicon, tungsten (W), or another material, are formed respectively. On the plug electrode 4a, the lower electrode 5a, ferroelectric film 6, and a pair of upper electrodes 7a and 7b are formed to provide a ferroelectric capacitor.

On the plug electrode 4b, the lower electrode 5b is formed. No upper electrode is formed on the lower electrode 5b. Contacts 8a are formed on the upper electrodes 7a and 7b, and a contact 8b is formed on the lower electrode 5b. The contacts 8a and 8b are connected to the metal wiring 9.

A method of manufacturing the memory cell area of the semiconductor device of the first embodiment will be explained with reference to FIGS. 2A to 2G. In each of these figures, a left section corresponds to the A-B section of FIG. 1A and a right section to the C-D section of FIG. 1A.

Figure 2A:
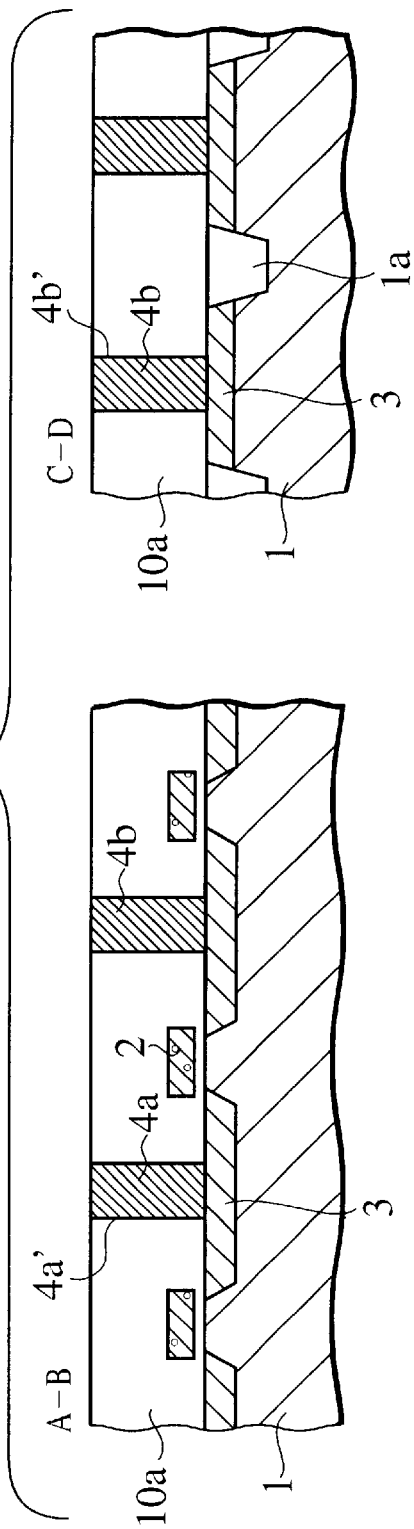

In FIG. 2A, memory cell transistors are formed on a semiconductor substrate 1, and plug electrodes 4a and 4b are formed. More precisely, element areas isolated from each other with element isolation regions 1a are defined on a main surface of the semiconductor substrate 1. A gate oxide film is formed on the substrate 1, and gate electrodes 2 are formed on the gate oxide film. Source/drain regions 3 are formed by, for example, ion implantation.

On the main surface of the substrate 1 where the memory cell transistors have been formed, an insulating interlayer 10a is deposited and the surface thereof is planarized. Contact holes 4a' and 4b' for plug electrodes 4a and 4b are opened through the interlayer 10a. Electrode material such as doped polysilicon or tungsten (W) is deposited in the contact holes, to form the plug electrodes 4a and 4b. The surface of he substrate is planarized by CMP (chemical mechanical polishing) or CDE (chemical dry etching).

Figure 2B:
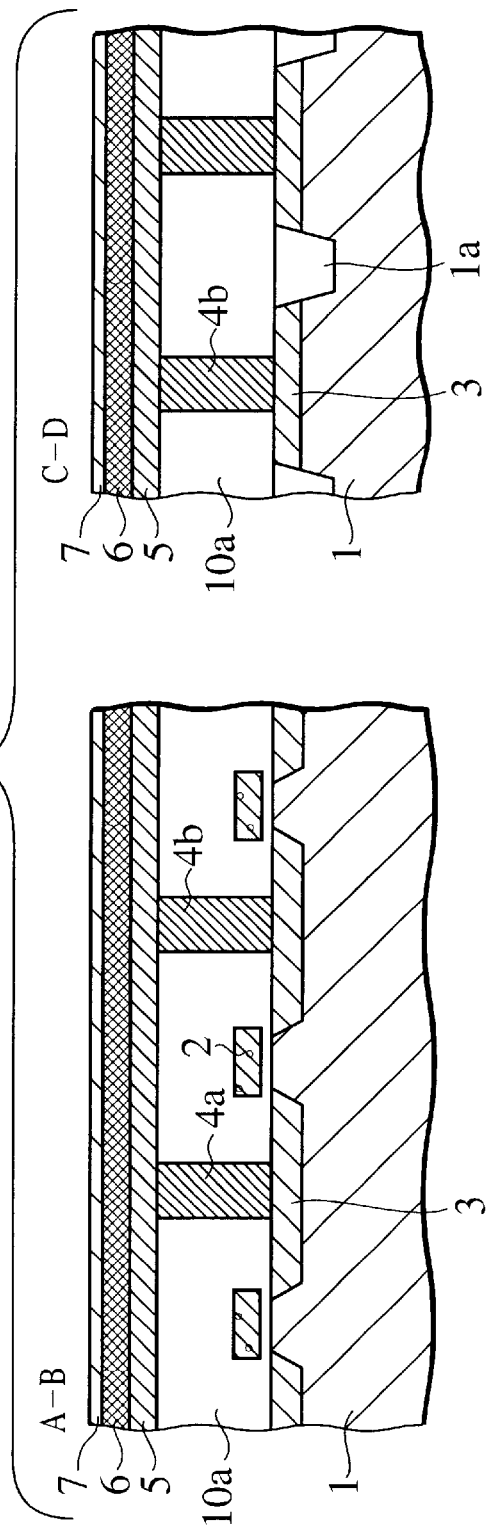

In FIG. 2B, electrode material such as platinum (Pt), iridium (Ir), or iridium oxide film ($IrO_2$) is deposited in contact with the plug electrodes 4a and 4b, to form a lower electrode layer 5 serving as lower electrodes 5a and 5b. $PZT(Pb(Zr,Ti)O_3)$ or $SBT(SrBi_2Ta_2O_9)$ is deposited to form a ferroelectric film 6. Electrode material such as Pt, Ir, or $IrO_2$ is deposited to form an upper electrode layer 7 serving as upper electrodes 7a and 7b.

In FIG. 2C, the upper electrode layer 7 is patterned by standard lithography to form each pair of upper electrodes 7a and 7b.

In FIG. 2D, the ferroelectric film 6 and lower electrode layer 5 are patterned by lithography. At this time, the lower electrode layer 5 is patterned to leave the lower electrode 5b on each plug electrode 4b. The ferroelectric film 6 may partly be left on each lower electrode 5b.

In FIG. 2E, P (plasma)-TEOS or $O_3$-TEOS is deposited on the substrate 1 to form an insulating interlayer 10b. The surface of the interlayer 10b is planarized.

In FIG. 2F, wiring trenches 10c for metal wiring 9 are formed on the insulating interlayer 10b.

Figure 2G:
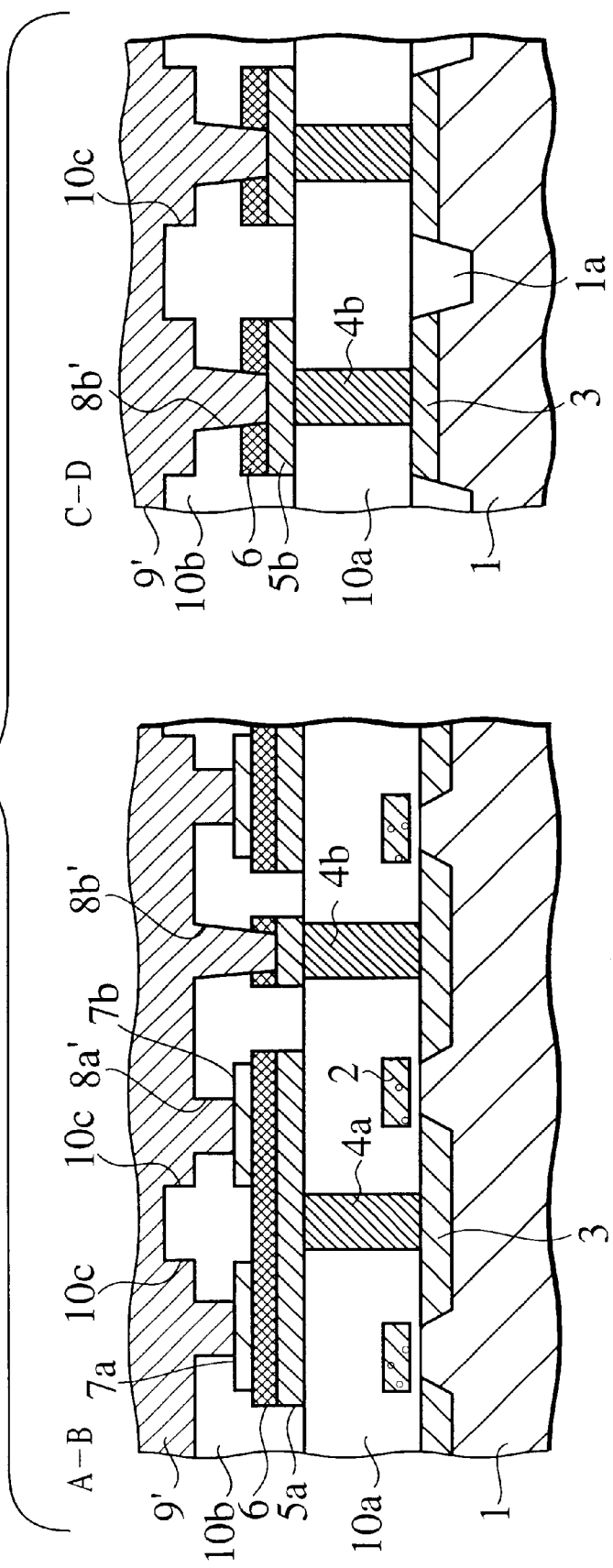

In FIG. 2G, contact holes 8a' for contacts 8a corresponding to the upper electrodes 7a and 7b and contact holes 8b' for contacts 8b corresponding to the lower electrodes 5b are opened. At the bottoms of the contact holes, the upper electrodes 7a and 7b and lower electrodes 5b are exposed. These electrodes are made of material that is highly resistive to a high-temperature oxidizing atmosphere. Accordingly, it is possibly to carry out annealing in an oxidizing atmosphere to cure the ferroelectric film 6 damaged during the opening of the contact holes. The wiring trenches 10c and contact holes 8a' and 8b' are filled with, for example, Al (aluminum) 9' that may reflow. The Al layer 9' is processed by etch-back or CMP to form metal wiring 9, thereby completing the memory cell area of the semiconductor device according to the first embodiment shown in FIGS. 1A to 1C.

According to the first embodiment, all of the plug electrodes 4a and 4b in memory cells are covered with the lower electrodes 5a and 5b. Since the lower electrodes 5a and 5b contain oxygen blocking material such as Pt, Ir, or $IrO_2$, damage on the ferroelectric film 6 due to reactive ion etching to form the contact holes 8a' and 8b' is curable by annealing. Namely, this embodiment connects each of the upper electrodes 7a and 7b to the corresponding source/drain region 3 through the metal wiring 9, the contact 8b, the lower electrode 5b, and the plug electrode 4b.

The wiring 9 for connecting the upper electrode 7b to the corresponding source/drain region 3 is connected to the contact 8b, which is connected to the lower electrode 5b and plug electrode 4b. This structure enables the curative annealing of the ferroelectric film 6 to be carried out after the formation of the contact holes 8a' and 8b', thereby providing the ferroelectric capacitors of the semiconductor device with proper characteristics.

The lateral size of the lower electrode 5b may sufficiently be larger than the opening of the contact 8b, to secure electric conduction between the contact 8b and the lower electrode 5b even if the contact 8b is misaligned with the lower electrode 5b.

[Second embodiment]

Figure 3A:
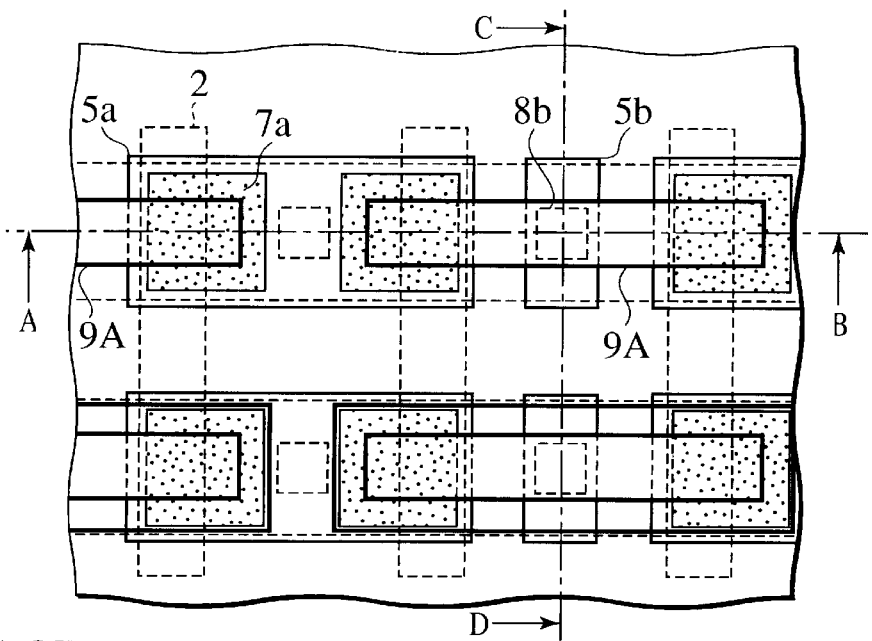
FIG. 3A is a plan view partly showing the structure of a ferroelectric memory cell area of a semiconductor device according to a second embodiment of the present invention.
Figure 3B:
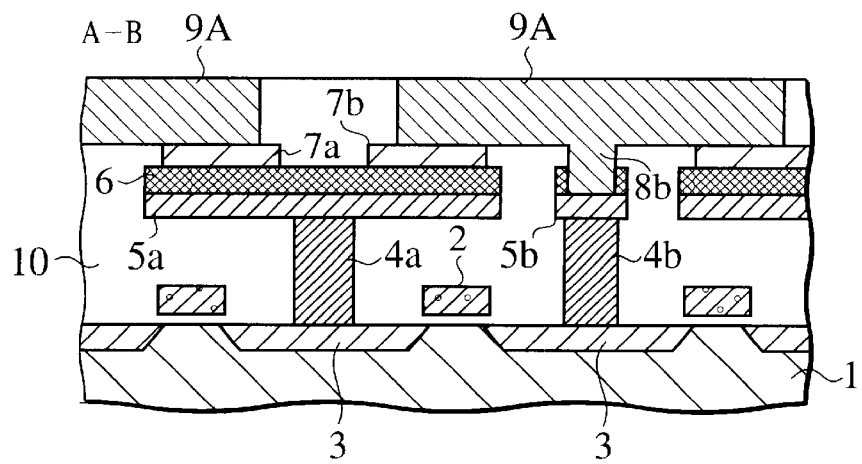
FIGS. 3B and 3C are sectional views showing the ferroelectric memory cell area of FIG. 3A.
Figure 3C:
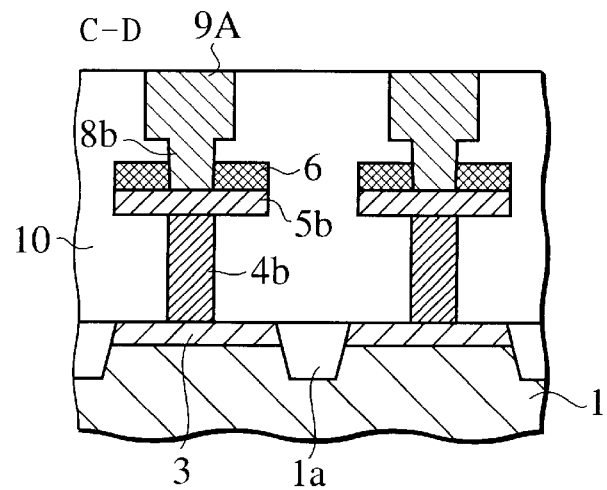

FIGS. 3A, 3B, and 3C partly show the structure of a ferroelectric memory cell area of a semiconductor device according to the second embodiment of the present invention, in which FIG. 3A is a plan view, FIG. 3B a section taken along a line A-B of FIG. 3A, and FIG. 3C a section taken along a line C-D of FIG. 3A.

The second embodiment differs from the first embodiment in that metal wiring 9A of the second embodiment serves as the contacts 8a of the upper electrodes 7a and 7b of the first embodiment. Namely, the metal wiring 9A is directly in contact with the upper electrodes 7a and 7b. The metal wiring 9A is connected to a lower electrode 5b through a contact 8b .

To manufacture the semiconductor device of the second embodiment, the process of FIG. 2E of the first embodiment is carried out to form an insulating interlayer 10b. Contact holes for contacts 8b reaching lower electrodes 5b are opened through the interlayer 10b. At the same time, wiring trenches 10c reaching upper electrodes 7a and 7b are formed. The wiring trenches 10c are filled with metal such as aluminum (Al) 9'.

This manufacturing method can separately form the wiring trenches 10c on the upper electrodes 7a and 7b and the contact holes on the lower electrodes 5b without increasing the number of masks. Accordingly, optimum RIE (reactive ion etching) conditions are separately selectable for the wiring trenches 10c and for the contact holes in such a way as to reduce RIE damage on ferroelectric capacitors during the formation of the wiring trenches 10c on the upper electrodes 7a and 7b.

[Third embodiment]

Figure 4A:
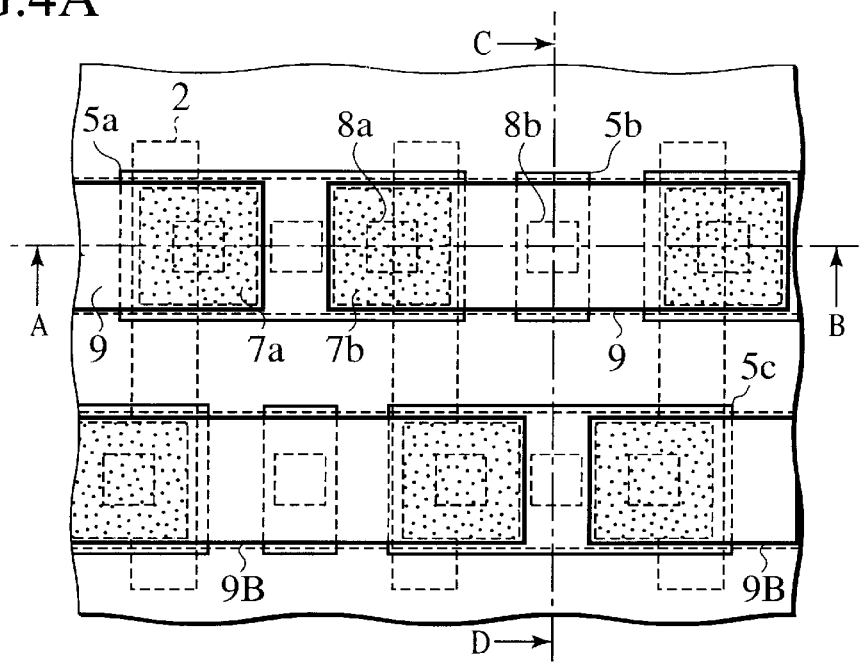
FIG. 4A is a plan view partly showing the structure of a ferroelectric memory cell area of a semiconductor device according to a third embodiment of the present invention.
Figure 4B:
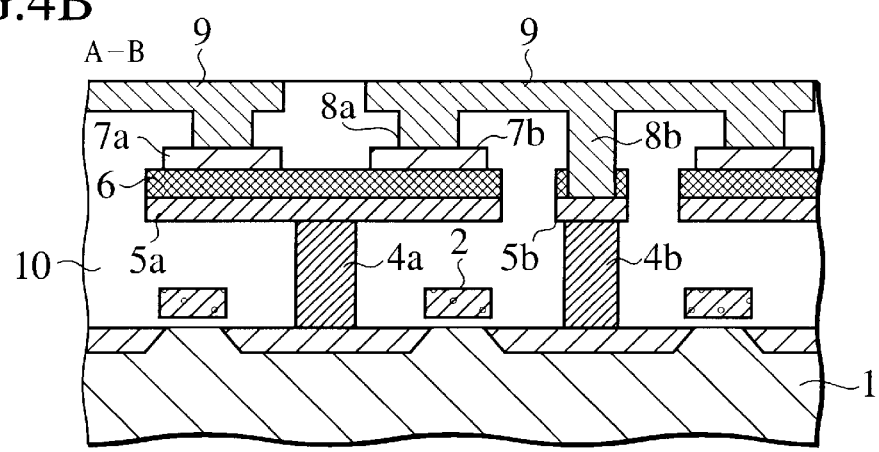
FIGS. 4B and 4C are sectional views showing the ferroelectric memory cell area of FIG. 4A.
Figure 4C:
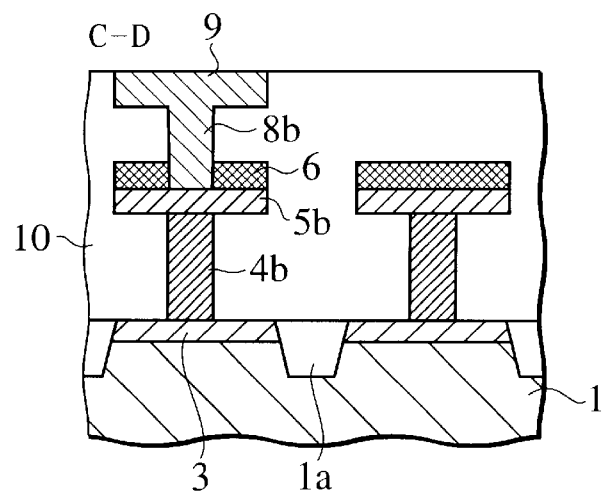

FIGS. 4A, 4B, 4C partly show the structure of a ferroelectric memory cell area of a semiconductor device according to the third embodiment of the present invention, in which FIG. 4A is a plan view, FIG. 4B a section taken along a line A-B of FIG. 4A, and FIG. 4C a section taken along a line C-D of FIG. 4A.

The third embodiment differs from the first embodiment in that the third embodiment forms memory cells in a point symmetrical manner. As shown in FIG. 4A, an upper row structure is shifted from a lower row structure by a half pitch.

The third embodiment provides the same effect as the first embodiment.

[Fourth embodiment]

Figure 5A:
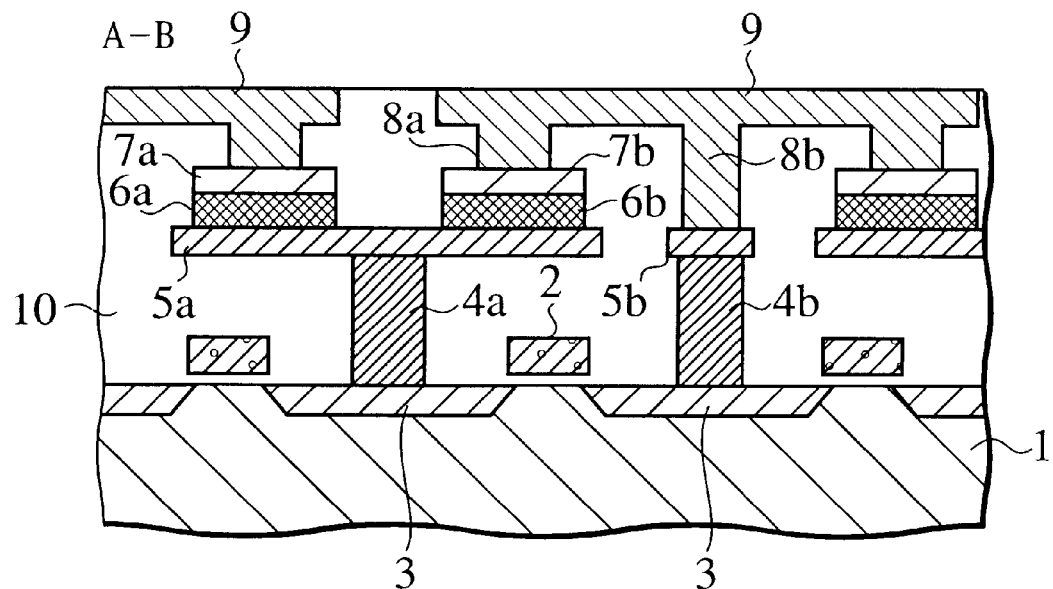
FIGS. 5A and 5B are sectional views partly showing the structure of a ferroelectric memory cell area of a semiconductor device according to a fourth embodiment of the present invention.
Figure 5B:
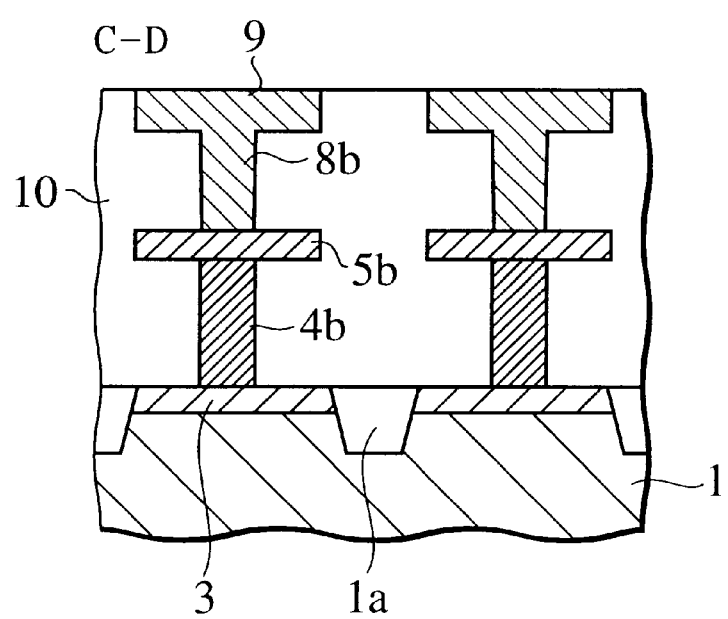

FIGS. 5A and 5B partly show the structure of a ferroelectric memory cell area of a semiconductor device according to the fourth embodiment of the present invention, in which FIG. 5A is a section taken like FIG. 1B and FIG. 5B a section taken like FIG. 1C.

The fourth embodiment differs from the first embodiment in that a pair of ferroelectric films 6a and 6b is formed under upper electrodes 7a and 7b, respectively. The shapes of the ferroelectric films 6a and 6b are analogous to those of the upper electrodes 7a and 7b. Another difference of the fourth embodiment from the first embodiment is that no ferroelectric film 6 exists on each lower electrode 5b.

To manufacture the semiconductor device of the fourth embodiment, the process of FIG. 2D of the first embodiment is carried out to pattern a ferroelectric film 6 in a self aligning manner based on upper electrodes 7a and 7b.

This manufacturing method leaves no ferroelectric film 6 on each lower electrode 5b, and therefore, needs no etching on the ferroelectric film 6 when opening contact holes 8b'. The etching of the ferroelectric film 6 is a time consuming process, and without this, the fourth embodiment is capable of shortening an opening time of the contact holes 8b'. As a result, the fourth embodiment shortens an opening time of contact holes 8a' on the upper electrodes 7a and 7b, thereby reducing damage on the ferroelectric films 6a and 6b.

[Fifth embodiment]

Figure 6A:
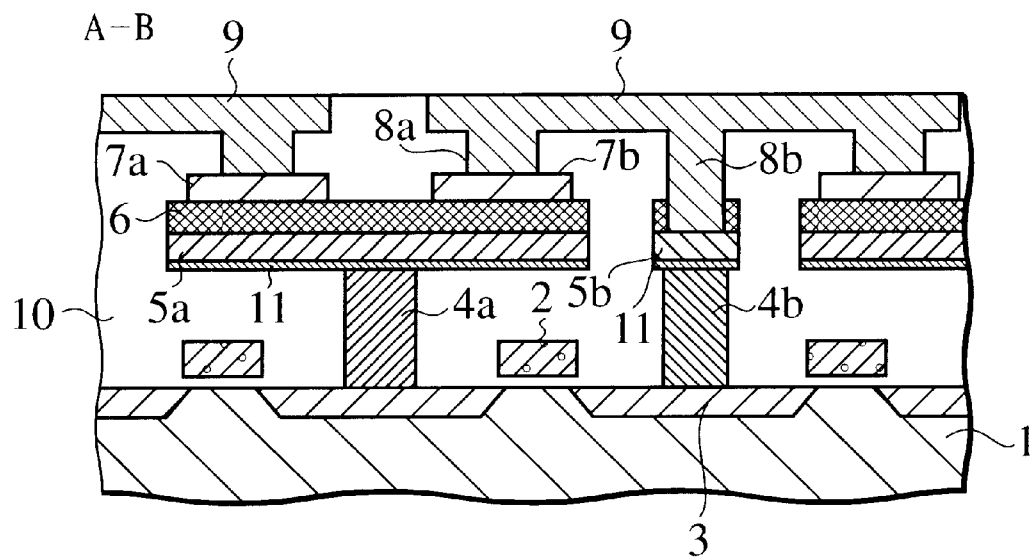
FIGS. 6A and 6B are sectional views partly showing the structure of a ferroelectric memory cell area of a semiconductor device according to a fifth embodiment of the present invention.
Figure 6B:
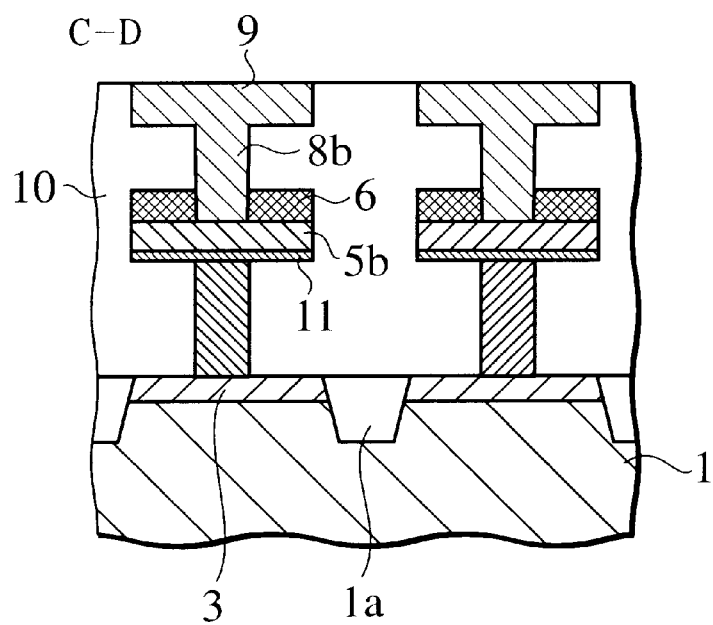

FIGS. 6A and 6B partly show the structure of a ferroelectric memory cell area of a semiconductor device according to the fifth embodiment of the present invention, in which FIG. 6A is a section taken like FIG. 1B and FIG. 6B a section taken like FIG. 1C.

The fifth embodiment differs from the first embodiment in that an oxidation resistive conductor film 11 that can prevent oxygen diffusion is formed on plug electrodes 4a and 4b in a self-aligning manner based on lower electrodes 5a and 5b. The film 11 is made of, for example, Ir, $IrO_2$, Ru, or $RuO_2$ that is conductive after being exposed to an oxidizing atmosphere.

To manufacture the semiconductor device of the fifth embodiment, after carrying the process of FIG. 2A of the first embodiment, an oxidation resistive conductor film 11 is formed on the surface of an insulating interlayer 10a where plug electrodes 4a and 4b are exposed. A lower electrode layer 5 is formed on the film 11.

Due to the oxidation resistive conductor film 11, the semiconductor device of the fifth embodiment is capable of preventing the oxidation of the plug electrodes 4a and 4b during curative annealing carried out after the opening of contact holes.

[Sixth embodiment]

Figure 7A:
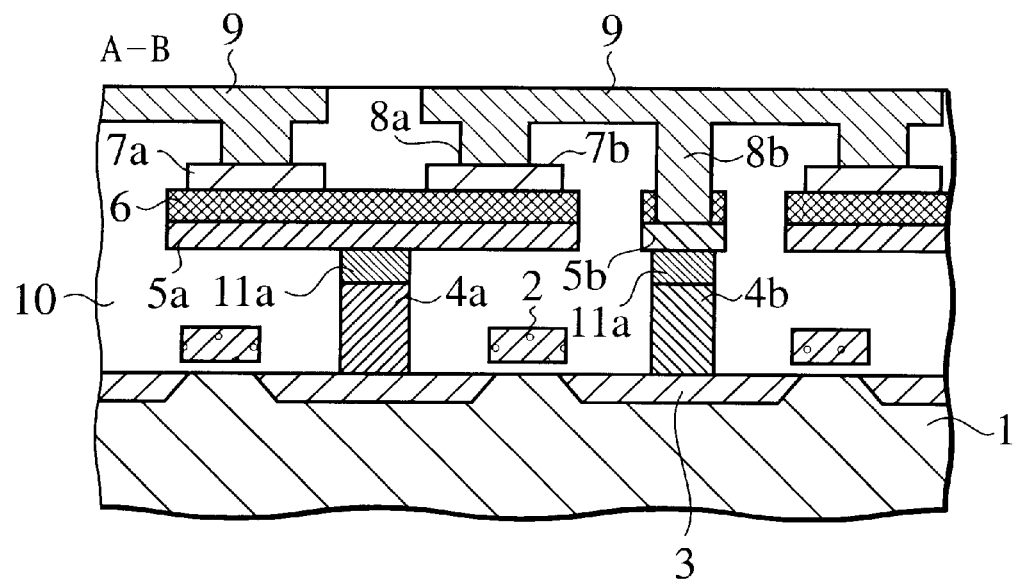
FIGS. 7A and 7B are sectional views partly showing the structure of a ferroelectric memory cell area of a semiconductor device according to a sixth embodiment of the present invention.
Figure 7B:
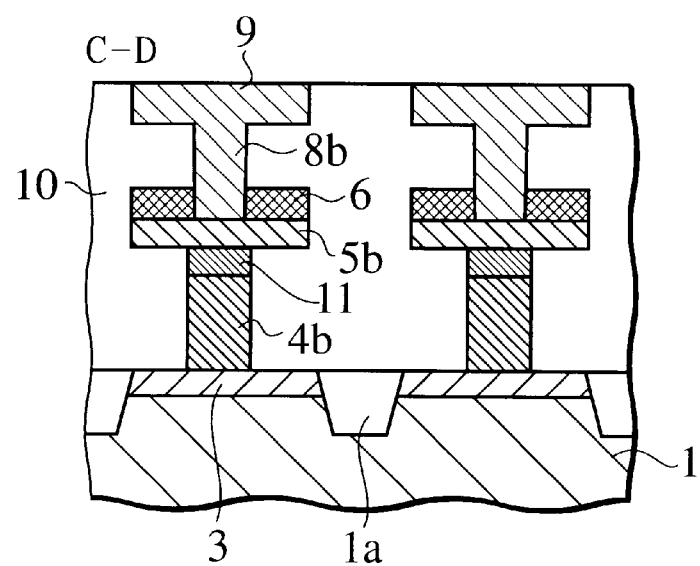

FIGS. 7A and 7B partly show the structure of a ferroelectric memory cell area of a semiconductor device according to the sixth embodiment of the present invention, in which FIG. 7A is a section taken like FIG. 1B and FIG. 7B a section taken like FIG. 1C.

The sixth embodiment differs from the first embodiment in that an oxidation resistive conductor film 11 a that is conductive after being exposed to an oxidizing atmosphere is buried on top of plug electrodes 4a and 4b.

To manufacture the semiconductor device of the sixth embodiment, the process of FIG. 2A of the first embodiment is carried out to bury plug electrode material in contact holes 4a' and 4b'. The plug electrode material is etched back to a level below the surface of an insulating interlayer 10a. The etched-back trenches are filled with an oxidation resistive conductor film 11a.

The sixth embodiment increases the effective thickness of the oxidation resistive conductor film 11a, to further improve the oxidation preventive effect of the plug electrodes 4a and 4b compared with the fifth embodiment. Even if a lower electrode 5b is misaligned with the plug electrode 4b, the sixth embodiment prevents the exposure of the top of the plug electrode 4b, thereby allowing a zero alignment margin.

[Seventh embodiment]

Figure 8A:
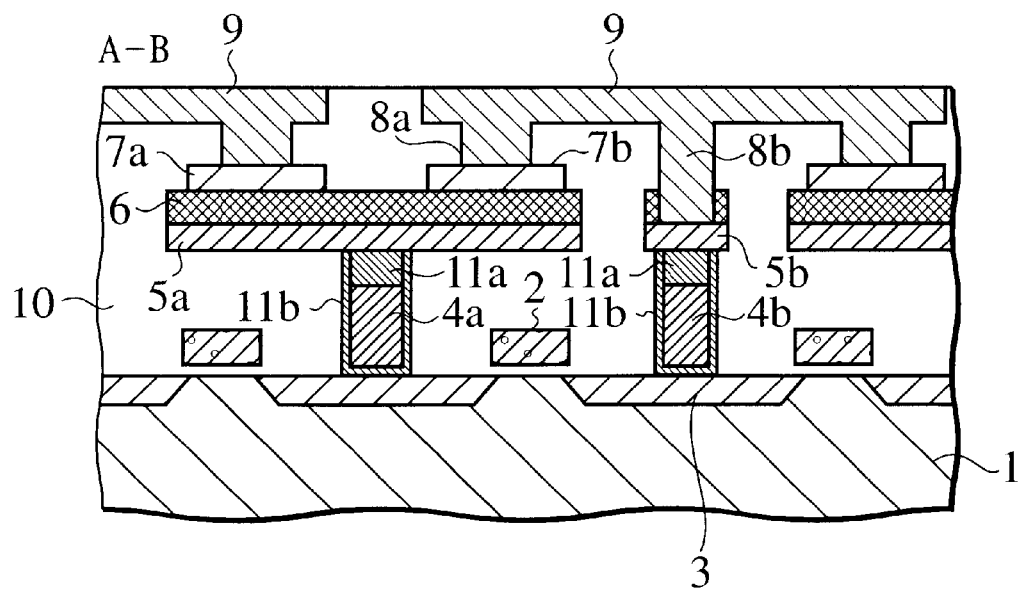
FIGS. 8A and 8B are sectional views partly showing the structure of a ferroelectric memory cell area of a semiconductor device according to a seventh embodiment of the present invention.
Figure 8B:
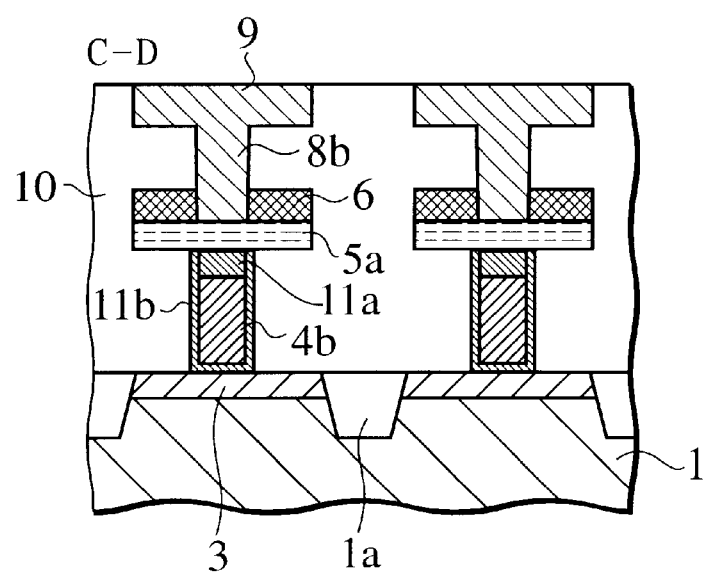

FIGS. 8A and 8B partly show the structure of a ferroelectric memory cell area of a semiconductor device according to the seventh embodiment of the present invention, in which FIG. 8A is a section taken like FIG. 1B and FIG. 8B a section taken like FIG. 1C.

The seventh embodiment differs from the first embodiment in that an oxidation resistive conductor film 11b is formed on the bottom and side face of each of plug electrodes 4a and 4b, and an oxidation resistive conductor film 11a is buried on top of the plug electrodes 4a and 4b, to substantially cover metal material of the plug electrodes 4a and 4b with the oxidation resistive conductor films.

To manufacture the semiconductor device of the seventh embodiment, the process of FIG. 2A of the first embodiment is carried out to deposit an oxidation resistive conductor film 11b on the internal wall of each of contact holes 4a' and 4b' and fill the contact holes 4a' and 4b' with plug electrode material. The filled plug electrode material is etched back to a level below the surface of an insulating interlayer 10a. The etched-back trenches are filled with an oxidation resistive conductor film 11a.

The seventh embodiment provides the same effect as the sixth embodiment. In addition, by completely covering the metal material of the plug electrodes 4a and 4b with the oxidation resistive conductor films, the seventh embodiment further improves the oxidation preventive effect of the plug electrodes 4a and 4b.

[Eighth embodiment]

Figure 9A:
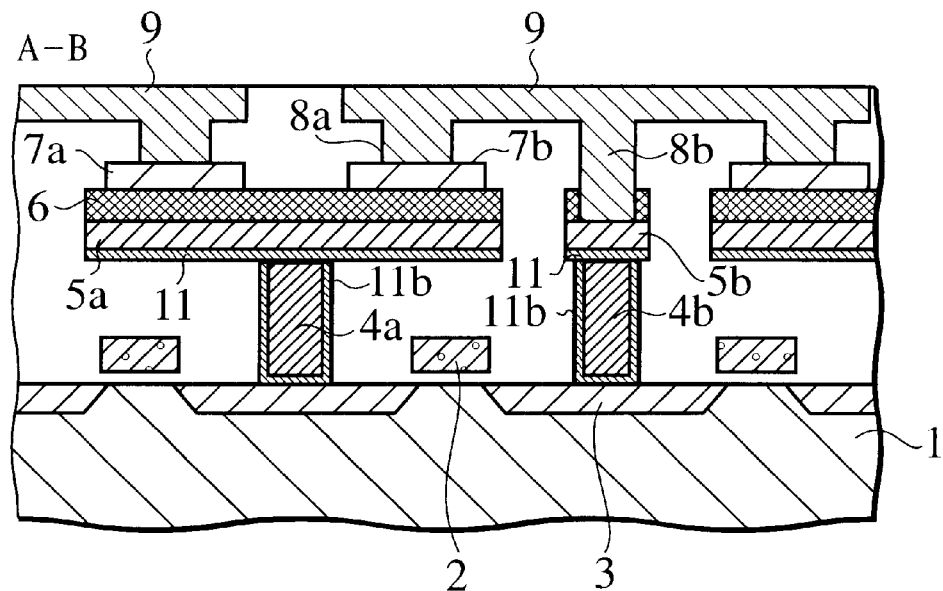
FIGS. 9A and 9B are sectional views partly showing the structure of a ferroelectric memory cell area of a semiconductor device according to an eighth embodiment of the present invention.
Figure 9B:
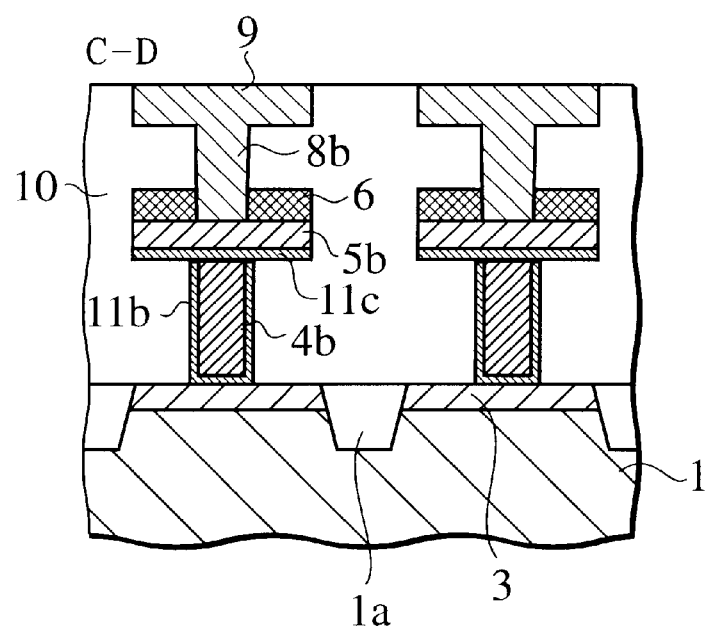

FIGS. 9A and 9B partly show the structure of a ferroelectric memory cell area of a semiconductor device according to the eighth embodiment of the present invention, in which FIG. 9A is a section taken like FIG. 1B and FIG. 9B a section taken like FIG. 1C.

The eighth embodiment differs from the first embodiment in that an oxidation resistive conductor film 11b is formed on the bottom and side face of each of plug electrodes 4a and 4b and an oxidation resistive conductor film 11 is formed on each of the plug electrodes 4a and 4b in a self aligning manner with respect to lower electrodes 5a and 5b. Namely, the eighth embodiment entirely covers metal material of each plug electrode with the oxidation resistive conductor films.

To manufacture the semiconductor device of the eighth embodiment, the process of FIG. 2A of the first embodiment is carried out to form an oxidation resistive conductor film 11b on the bottom and side face of each of contact holes 4a' and 4b', and then the contact holes are filled with plug electrode material. An oxidation resistive conductor film 11 is formed on the surface of an insulating interlayer 10a where plug electrodes 4a and 4b are exposed. On the film 11, a lower electrode layer 5 is formed. This manufacturing method is simpler than the seventh embodiment.

The oxidation resistive conductor film 11b may be formed only on the side face of each of the contact holes 4a' and 4b'. In this case, a contact between any one of the plug electrodes 4a and 4b and a corresponding source/drain region can be made with the metal material of the plug electrode having better ohmic characteristics.

[Ninth embodiment]

Figure 10A:
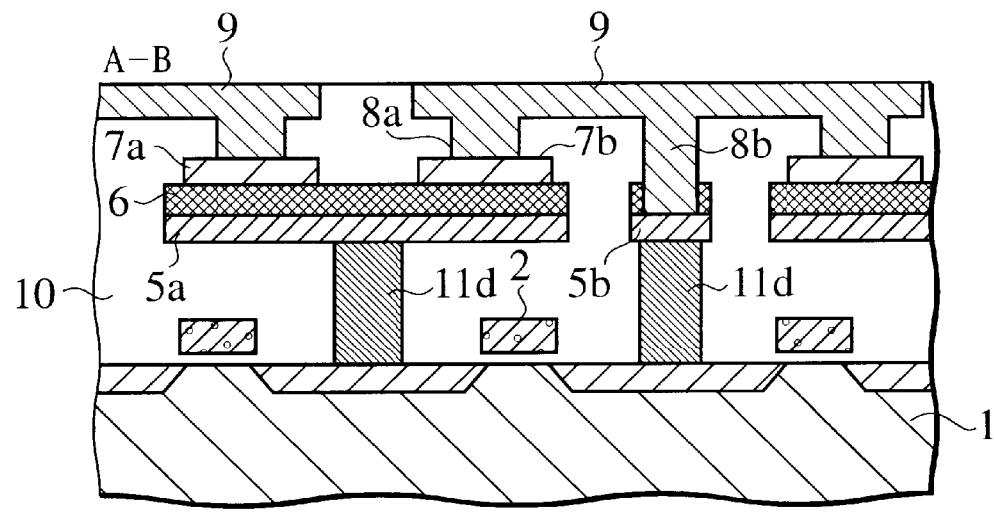
FIGS. 10A and 10B are sectional views partly showing the structure of a ferroelectric memory cell area of a semiconductor device according to a ninth embodiment of the present invention.
Figure 10B:
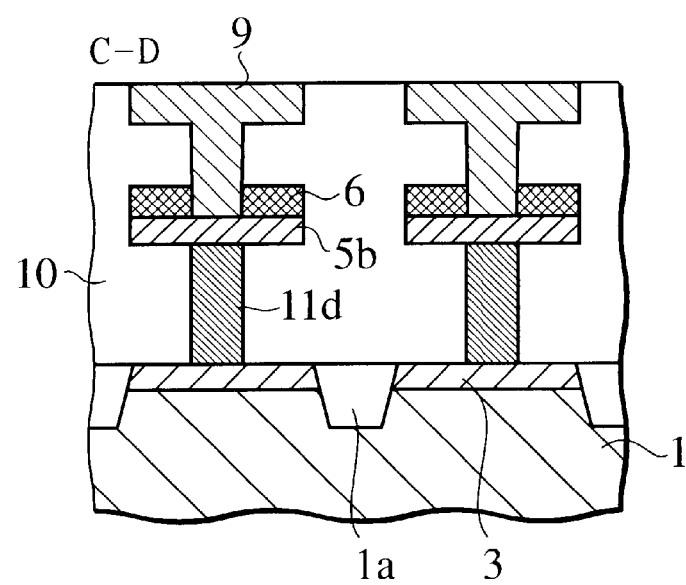

FIGS. 10A and 10B partly show the structure of a ferroelectric memory cell area of a semiconductor device according to the ninth embodiment of the present invention, in which FIG. 10A is a section taken like FIG. 1B and FIG. 10B a section taken like FIG. 1C.

The ninth embodiment differs from the first embodiment in that plug electrodes 4a and 4b are wholly made of an oxidation resistive conductor film 11d.

To manufacture the semiconductor device of the ninth embodiment, the process of FIG. 2A of the first embodiment is carried out to open contact holes 4a' and 4b'. Material for forming an oxidation resistive conductor film lid instead of plug electrode material is deposited in the contact holes 4a' and 4b'.

This manufacturing method is simpler than the fifth to eighth embodiments

[Tenth embodiment]

Figure 11A:
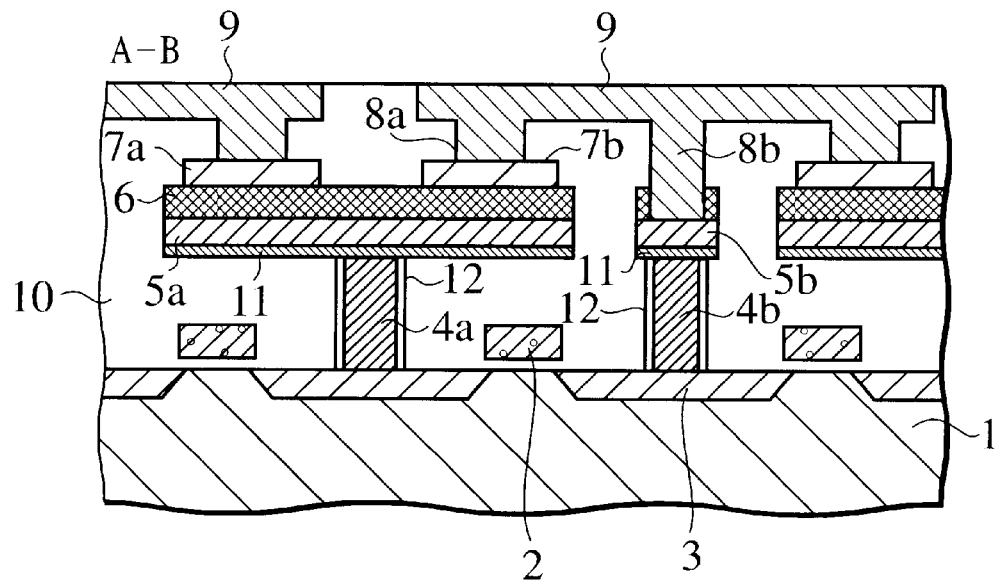
FIGS. 11A and 11B are sectional views partly showing the structure of a ferroelectric memory cell area of a semiconductor device according to a tenth embodiment of the present invention.
Figure 11B:
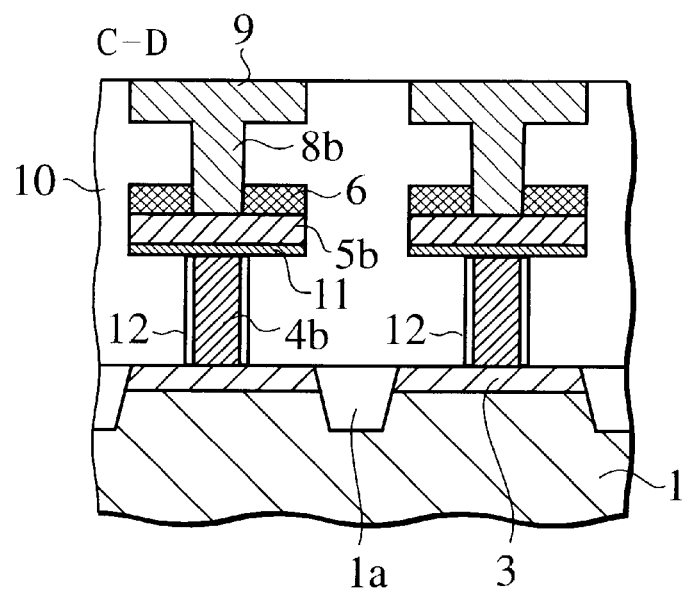

FIGS. 11A and 11B partly show the structure of a ferroelectric memory cell area of a semiconductor device having ferroelectric memory cells according to the tenth embodiment of the present invention, in which FIG. 11A is a section taken like FIG. 1B and FIG. 11B a section taken like FIG. 1C.

The tenth embodiment differs from the first embodiment in that an oxidation resistive insulating film 12 that prevents oxygen diffusion is formed on the side face of each of plug electrodes 4a and 4b. The oxidation resistive insulating film 12 is made of, for example, silicon nitride (SiNx), alumina (Al$_2$O$_3$), or silicon oxi-nitride (SiONx). The tenth embodiment also forms an oxidation resistive conductor film 11 under each of lower electrodes 5a and 5b. No oxidation resistive insulating film is formed on the bottom of each of the plug electrodes 4a and 4b.

To manufacture the semiconductor device of the tenth embodiment, the process of FIG. 2A of the first embodiment is carried out to form an oxidation resistive insulating film 12 as a sidewall of each of contact holes 4a' and 4b' before depositing plug electrode material into the contact holes, and forming an oxidation resistive conductor film 11 before forming a lower electrode layer 5.

The tenth embodiment forms no oxidation resistive insulating film 12 on the bottom of each of the contact holes 4a' and 4b', and therefore, causes no electric disconnection between source/drain regions and plug electrodes. At the same time, the tenth embodiment secures an oxidation preventive effect for the plug electrodes 4a and 4b. Even if the lower electrode 5b is misaligned with the plug electrode 4b, the tenth embodiment prevents the exposure of the top face of the plug electrode 4b, to ensure a zero alignment margin.

[Eleventh embodiment]

Figure 12:
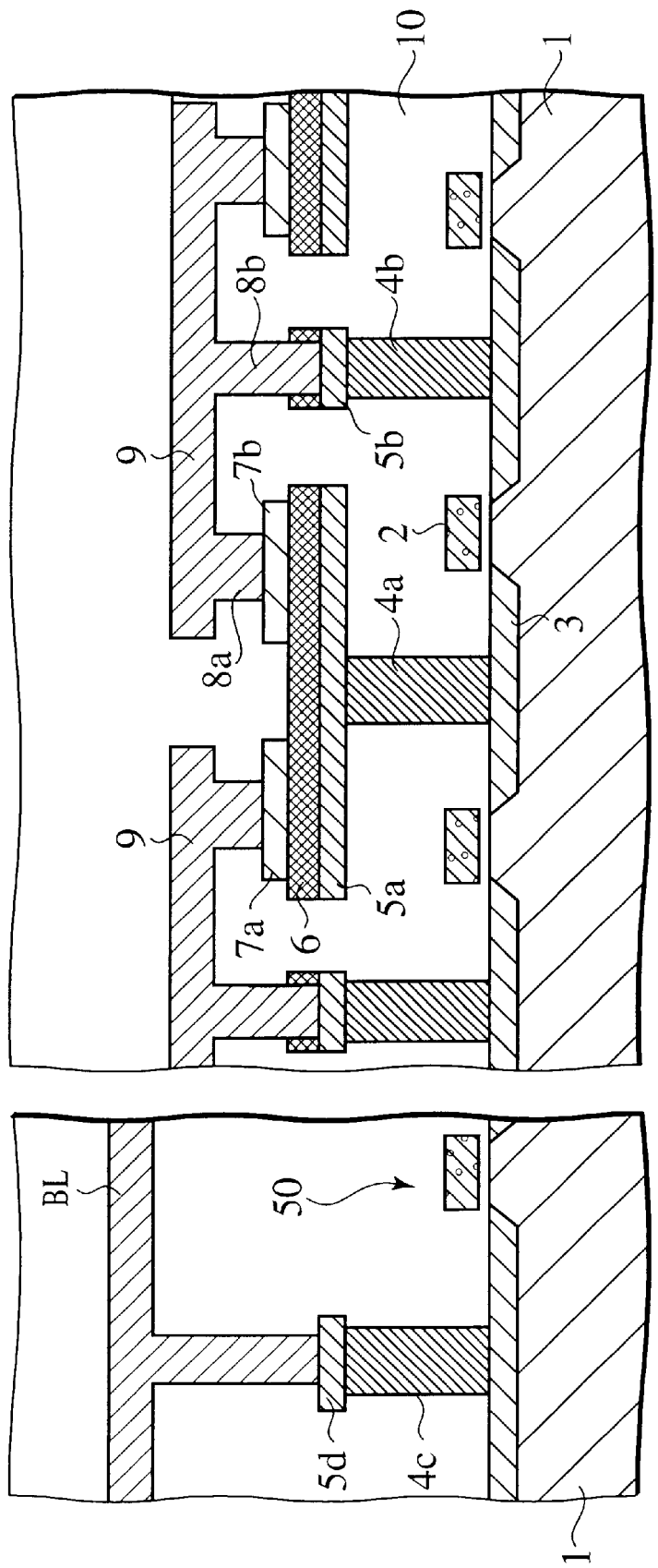
FIG. 12 is a sectional view partly showing the structure of a ferroelectric; memory cell area of a semiconductor device according to an eleventh embodiment of the present invention.

FIG. 12 is a sectional view partly showing the structure of a ferroelectric memory cell area and a bit line of a semiconductor device according to the eleventh embodiment of the present invention.

Figure 14:
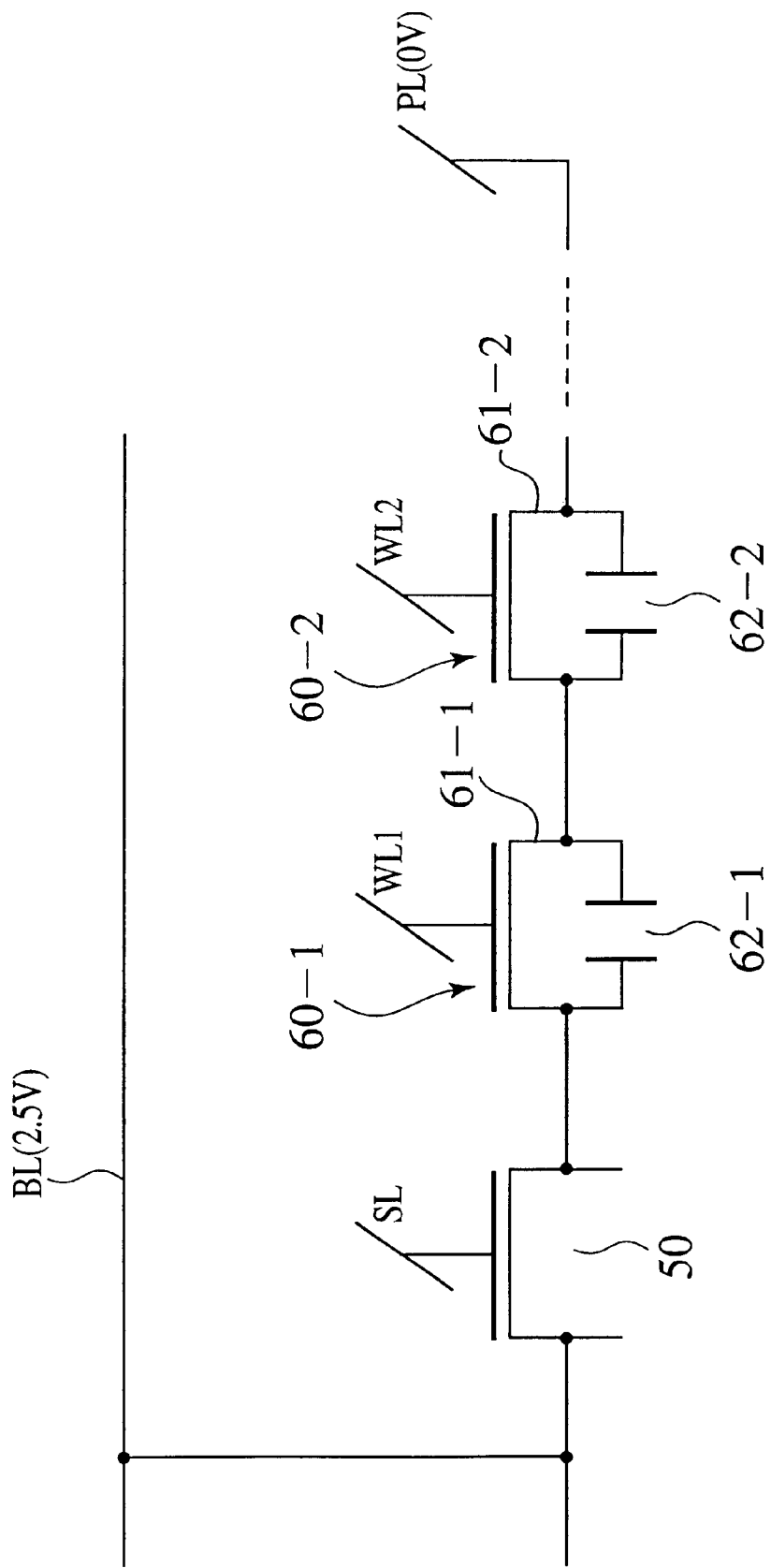
FIG. 14 is a circuit diagram partly showing a ferroelectric memory cell area of a Series connected TC unit type ferroelectric RAM.
Figure 15:
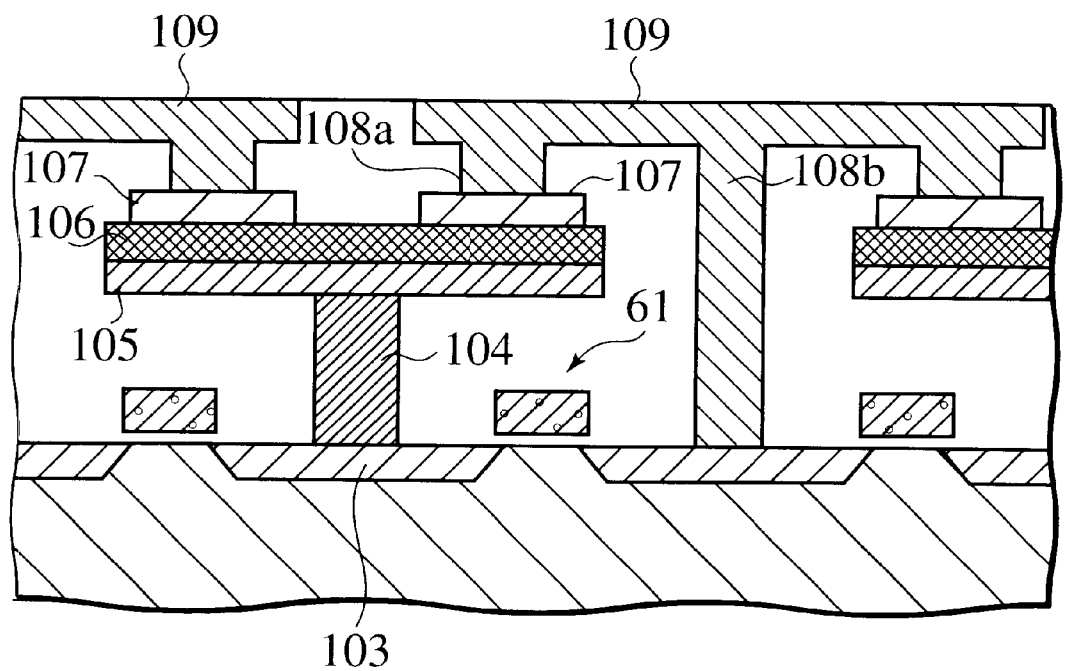
FIG. 15 is a sectional view partly showing the structure of a ferroelectric memory cell area of the Series connected TC unit type ferroelectric RAM of the prior art.

The structure of the memory cell area of the eleventh embodiment is the same as that of the first embodiment. The eleventh embodiment additionally forms a lower electrode 5d and a plug electrode 4c under each contact for bit lines. Namely, a bit line BL is connected to a source/drain region 3 of a select gate 50 (Refer to FIG. 14) through the lower electrode 5d and plug electrode 4c like in the memory cell area of the first embodiment.

The eleventh embodiment is capable of shortening a contact 12 for the bit line BL. Namely, a contact hole 12' opened for the contact 12 can be shallow. This prevents the contact hole 12' from being tapered and makes the adjustment of a contact shape easier.

The structure according to the eleventh embodiment is manufacturable during the manufacturing processes of the first embodiment.

The plug electrode structure of the eleventh embodiment is applicable to not only memory cells but also peripheral circuits, sense amplifiers, word line selectors, control circuits, etc., of a semiconductor device having ferroelectric memory cells.

[Twelfth embodiment]

Figure 13:
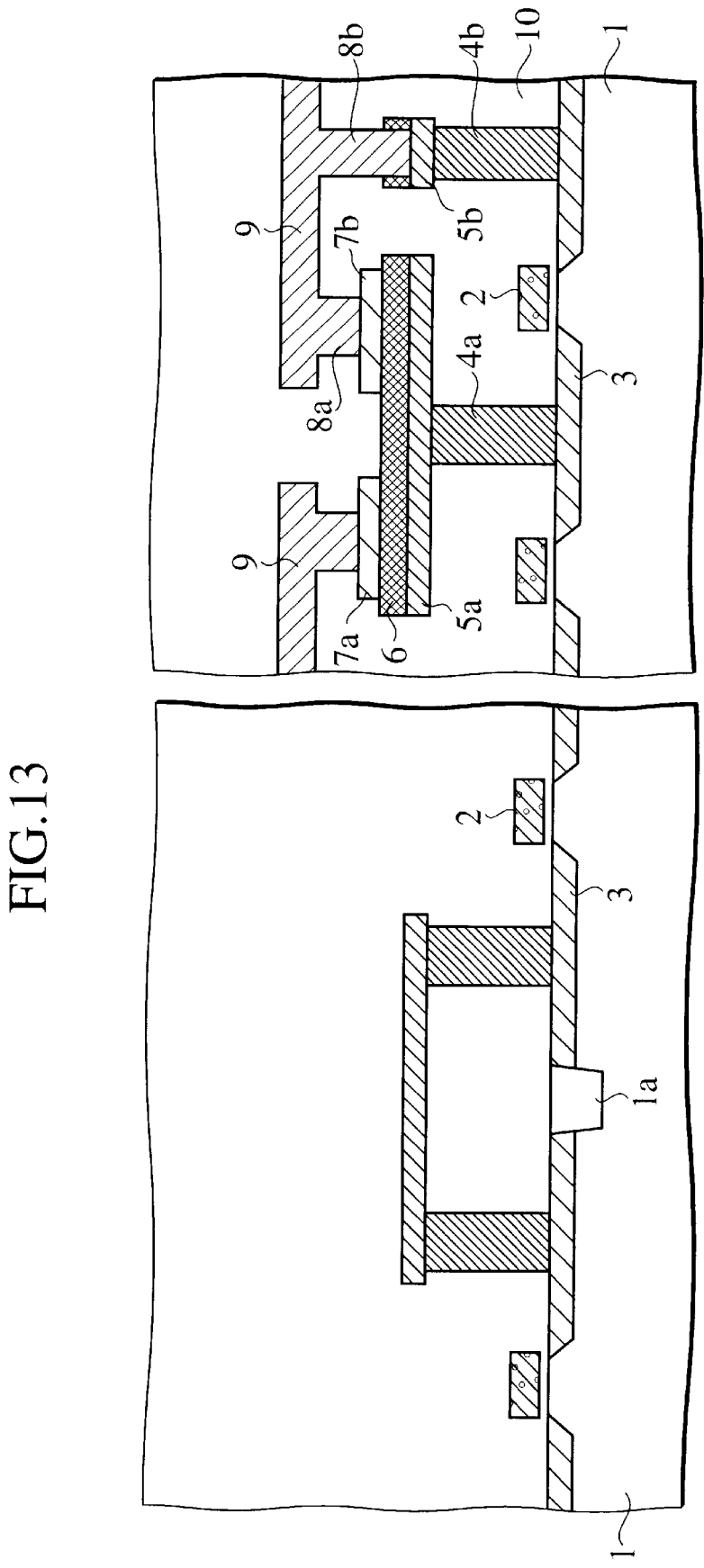
FIG. 13 is a sectional view partly showing the structure of a transistor cell and a ferroelectric memory cell areas of a semiconductor device according to a twelfth embodiment of the present invention.

FIG. 13 is a sectional view partly showing the structure of a ferroelectric memory cell area and a peripheral area of a semiconductor device according to the twelfth embodiment of the present invention.

The twelfth embodiment employs a lower electrode 5e for peripheral wiring in addition to the memory cell area. In the example of FIG. 13, the lower electrode 5e is used to electrically connect source/drain regions of different transistors to each other outside the memory cell area.

Using lower electrodes as wires for connecting plug electrodes on different source/drain regions or gate electrodes improves the degree of freedom of wiring designing and helps reduce the size of a semiconductor chip.

As explained above, the present invention connects each source/drain region of a ferroelectric memory cell to a wiring contact through a plug electrode and a lower electrode, so that no contact holes vulnerable to an oxidizing atmosphere may present when carrying out a curative annealing process. By sufficiently achieving the curative annealing process, present invention provides a semiconductor device having ferroelectric memory cells with proper ferroelectric capacitor characteristics.

Additional advantages and modifications of the present invention will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device having ferroelectric memory cells, comprising:

memory cell transistors formed on a semiconductor substrate, each of the memory cell transistors including first and second source/drain regions;

a first plug electrode formed on the first source/drain region;

a second plug electrode formed on the second source/drain region;

a ferroelectric capacitor having a first lower electrode, a ferroelectric film, and an upper electrode, formed on the first plug electrode;

a second lower electrode, which is made of the same layer of the first lower electrode, formed on the second plug electrode; and at least one contact and wiring connecting the upper electrode to the second lower electrode.

2. The semiconductor device having ferroelectric memory cells according to claim 1, wherein the upper electrode comprises a pair of upper-electrode segments formed on the ferroelectric film and connected to different second lower electrodes, respectively, through wiring.

3. The semiconductor device having ferroelectric memory cells according to claim 1, wherein the second lower electrode is connected to the wiring through a contact, a face of the second lower electrode facing the contact being greater than a face of the contact facing the second lower electrode.

4. The semiconductor device having ferroelectric memory cells according to claim 1, wherein the second lower electrode is connected to the wiring through a contact, and the upper electrode is directly connected to the wiring without a contact.

5. The semiconductor device having ferroelectric memory cells according to claim 1, wherein the ferroelectric film exists only on the first lower electrode.

6. The semiconductor device having ferroelectric memory cells according to claim 1, wherein the ferroelectric film has a plane shape analogous to a plane shape of the upper electrode.

7. The semiconductor device having ferroelectric memory cells according to claim 1, further comprising an oxidation resistive conductor interposed between the first lower electrode and the first plug electrode and between the second lower electrode and the second plug electrode.

8. The semiconductor device having ferroelectric memory cells according to claim 1, wherein at least an upper part of each of the first and second plug electrodes is made of material that is conductive after being exposed to an oxidizing atmosphere.

9. The semiconductor device having ferroelectric memory cells according to claim 1, wherein each of the first and second plug electrodes has an oxidation resistive conductor on at least one of the bottom and side face thereof.

10. The semiconductor device having ferroelectric memory cells according to claim 1, further comprising;
an oxidation resistive insulator formed on the side face of each of the first and second plug electrodes.

11. The semiconductor device having ferroelectric memory cells according to claim 1, further comprising:
third plug electrodes;
third lower electrodes, which are made of the same layer of the first lower electrode, formed on the third plug electrodes, respectively; and
bit lines connected to the third lower electrodes through contacts.

12. The semiconductor device having ferroelectric memory cells according to claim 1, further comprising:
peripheral circuits,
fourth plug electrodes in the peripheral circuits,
a fourth lower electrode, which is made of the same layer of the first lower electrode, formed on each of the fourth plug electrodes; and
wiring connected to the fourth lower electrode through a contact.

13. The semiconductor device having ferroelectric memory cells according to claim 1, further comprising;
fifth lower electrodes, which are made of the same layer of the first lower electrode, each of the fifth lower electrodes connecting plug electrodes formed on different source/drain regions or gate electrodes to each other.

* * * * *